(12) United States Patent
Kamgaing

(10) Patent No.: US 11,140,723 B2
(45) Date of Patent: Oct. 5, 2021

(54) PATCH ON INTERPOSER PACKAGE WITH WIRELESS COMMUNICATION INTERFACE

(71) Applicant: Intel Corporation, Santa Clara, CA (US)

(72) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 15/748,449

(22) PCT Filed: Dec. 2, 2015

(86) PCT No.: PCT/US2015/063516
§ 371 (c)(1),
(2) Date: Jan. 29, 2018

(87) PCT Pub. No.: WO2017/052674
PCT Pub. Date: Mar. 30, 2017

(65) Prior Publication Data
US 2018/0218986 A1  Aug. 2, 2018

Related U.S. Application Data

(63) Continuation-in-part of application No. PCT/US2015/052463, filed on Sep. 25, 2015.

(51) Int. Cl.
*H01L 23/00* (2006.01)
*H04W 76/10* (2018.01)
(Continued)

(52) U.S. Cl.
CPC .............. *H04W 76/10* (2018.02); *H01L 23/66* (2013.01); *H01L 24/17* (2013.01);
(Continued)

(58) Field of Classification Search
CPC .............................. H04W 76/10; H01L 23/66
See application file for complete search history.

(56) References Cited

U.S. PATENT DOCUMENTS

2009/0016417 A1   1/2009  Rofougaran
2010/0327068 A1*  12/2010 Chen ................ G06K 19/07749
                                                    235/492
(Continued)

FOREIGN PATENT DOCUMENTS

KR   10-2004-0027930   4/2004
KR      10-1412946    6/2014
WO    WO-2012040376   3/2012

OTHER PUBLICATIONS

International Search Report and Written Opinion for International Patent Application No. PCT/US2015/063516 dated Jul. 11, 2016, 16 pgs.

(Continued)

*Primary Examiner* — Mounir S Amer
*Assistant Examiner* — Alexander Belousov
(74) *Attorney, Agent, or Firm* — Schwabe, Williamson & Wyatt, P.C.

(57) ABSTRACT

A patch on interposer (PoINT) package is described with a wireless communications interface. Some examples include an interposer, a main patch attached to the interposer, a main integrated circuit die attached to the patch, a second patch attached to the interposer, and a millimeter wave radio die attached to the second patch and coupled to the main integrated circuit die through the interposer to communicate data between the main die and an external component.

20 Claims, 6 Drawing Sheets

(51) Int. Cl.
*H01L 25/065* (2006.01)
*H01L 25/16* (2006.01)
*H01L 23/66* (2006.01)
*H01Q 1/22* (2006.01)
*H04B 1/48* (2006.01)
*H04Q 1/02* (2006.01)
*H05K 7/14* (2006.01)
*H01Q 3/30* (2006.01)
*H04B 1/38* (2015.01)

(52) U.S. Cl.
CPC ...... *H01L 25/0655* (2013.01); *H01L 25/0657* (2013.01); *H01L 25/16* (2013.01); *H01Q 1/2266* (2013.01); *H01Q 1/2283* (2013.01); *H04B 1/48* (2013.01); *H04Q 1/15* (2013.01); *H05K 7/1487* (2013.01); *H01L 24/16* (2013.01); *H01L 24/73* (2013.01); *H01L 2223/6616* (2013.01); *H01L 2223/6677* (2013.01); *H01L 2223/6683* (2013.01); *H01L 2223/6688* (2013.01); *H01L 2224/16221* (2013.01); *H01L 2224/16235* (2013.01); *H01L 2224/73253* (2013.01); *H01L 2225/0652* (2013.01); *H01L 2225/06517* (2013.01); *H01L 2225/06548* (2013.01); *H01L 2225/06572* (2013.01); *H01L 2225/06589* (2013.01); *H01L 2924/1033* (2013.01); *H01L 2924/10253* (2013.01); *H01L 2924/10329* (2013.01); *H01L 2924/1421* (2013.01); *H01L 2924/1432* (2013.01); *H01L 2924/1434* (2013.01); *H01L 2924/15153* (2013.01); *H01L 2924/15192* (2013.01); *H01L 2924/15311* (2013.01); *H01L 2924/15313* (2013.01); *H01L 2924/15321* (2013.01); *H01L 2924/19105* (2013.01); *H01Q 3/30* (2013.01); *H04B 1/38* (2013.01)

(56) References Cited

U.S. PATENT DOCUMENTS

| | | |
|---|---|---|
| 2011/0156276 A1 | 6/2011 | Roberts et al. |
| 2011/0157808 A1 | 6/2011 | Roberts et al. |
| 2014/0176368 A1 | 6/2014 | Kamgaing et al. |

OTHER PUBLICATIONS

International Search Report and Written Opinion for International Patent Application No. PCT/US2015/052463 dated Jul. 11, 2016, 15 pgs.
Office Action from Taiwan Patent Application No. 105126206 dated Dec. 26, 2020, 10 pgs.
International Preliminary Search Report for PCT/US2015/063516 dated Apr. 5, 2018, 12 pages.
Notice of Allowance from Taiwan Patent Application No. 105126206, dated Mar. 24, 2021, 3 pgs.

* cited by examiner

PATCH ON INTERPOSER PACKAGE WITH WIRELESS COMMUNICATION INTERFACE

CROSS-REFERENCE TO RELATED APPLICATION

This application is a U.S. National Phase Application under 35 U.S.C. § 371 of International Application No. PCT/US2015/063516, filed Dec. 2, 2015, entitled "PATCH ON INTERPOSER PACKAGE WITH WIRELESS COMMUNICATION INTERFACE," which is a continuation-in-part of prior International Application Serial No. PCT/US15/52463, filed 25 Sep. 2015, entitled Microelectronic Package with Wireless Interconnect by Telesphor Kamgaing et al., the contents of which are hereby incorporated by reference fully herein and the priority of which is hereby claimed.

FIELD

The present description pertains to communication between integrated circuit packages and, in particular, to communication using a wireless radio transceiver.

BACKGROUND

In multiple CPU servers, multiple CPU high performance computers and other multiple chip systems, direct communication between different CPUs can greatly enhance the overall system performance. Direct communication reduces the communication overhead and the latency. This is particularly true for usage scenarios in which the data is written to shared memory pools. Direct communication may be achieved by adding a switch or a switch matrix on the system board that carries the CPU's.

The connections to the switch can be made through the system board. This requires that the data is carried through the socket pins, for socketed CPUs. The number of socket connections is limited by the size of the socket. The data rate is also limited by the materials and interfaces between the CPU, the socket, and the system board. The connections to the switch may also be made using flex top side connectors. These connectors connect one chip to another directly with a dedicated cable avoiding the socket and the system board. Top side connectors provide higher data rates, but are more expensive. In addition, the package is more complex and assembly of the packages into a system is more complex because the cables must be placed and connected after all of the chips are in place.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein a wireless interconnect may be integrated on a server package with PoINT (Patch on Interposer) architecture and similar types of packages. The patch may be a multilayer organic package substrate that uses ultra-thin build-up layers and advanced substrate design rules. The design rules may be compatible with the latest silicon nodes. This allows dies to be assembled on a patch with a fine C4 bump pitch of a few hundred to less than 100 µm. The patch is attached to an interposer. The interposer may also be based on a multilayer organic substrate technology but at a much lower cost with lower precision. The interposer design rules may be more similar to those of printed circuit boards for lower cost. The interposer is typically coupled to the patch using solder ball grid arrays. In some embodiments, the patch may be an N-node compatible substrate, whereas the interposer is (N−M)-node compatible, with M being greater than or equal to 1.

For a more conventional integrated circuit server and microserver packages, a wireless interconnect may be placed at the edge of the package. This minimizes interference with obstructions such as the integrated heat spreader (IHS) and the heat sink. On a package with PoINT architecture, the interposer used as a supporting substrate for the integrated circuit die typically uses lower cost and less precise materials and fabrication processes. As a result, the fine pitch transceiver chips of a wireless interconnect are difficult to attach to the interposer.

As described herein additional patches may be attached near the edge of the package to support a millimeter wave wireless interconnect die. The transceiver die may then be assembled on the patch and the antenna may be integrated either in the patch or inside the interposer.

Figure 1:
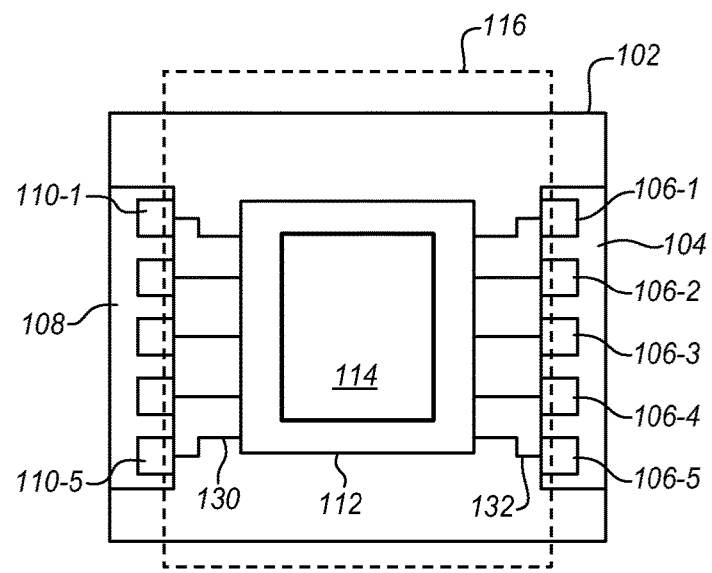
FIG. 1 is a top plan view of a wireless interconnect for chip-to-chip communications on a patch on interposer package according to an embodiment.

The small patches allow millimeter wave transceiver dies to be placed in any desired location without using a more expensive or precise package substrate. This allows the lower cost benefits of the interposer to be combined with the many benefits of package mounted millimeter wave wireless interconnects including architecture flexibility and interconnect reconfiguration. In some embodiments, the antenna implemented inside the interposer has a larger bandwidth as result of the thickness of the interposer as compared to more expensive package substrates. Implementing the radio on a patch reduces many of the potential costs that might be associated with enabling fine pitch assembly on an interposer FIG. 1 is a top plan view of an example PoINT package showing wireless interconnects on two opposite side of the main die. In this embodiment the main die is a central processing unit (CPU) die. There may be more or fewer wireless interconnects and they may be placed in different positions including positions on the other two sides of the interposer. While there is room on the sides of the interposer, the design rules for the interposer of a PoINT package substrate are too coarse to accommodate the assembly of a fine pitch millimeter-wave radio die.

The main integrated circuit die 114, in this case a CPU (Central Processing Unit) is assembled on a patch 112 on the interposer 102 at the center of the package. A similar package may be used for a different type of processor, a memory die, or a communications interface. Transceiver dies 106-1 to 106-5, and 110-1, to 110-5 are assembled on one or many patches 104, 108 which are attached at the edges of the interposer. In some embodiments, the transceiver dies are first attached to the respective patches and then assembled onto the interposer. The patches carrying the radios are mounted near the edge of the interposer to provide a more clear radiation path to a nearby external component. At the edges, the patches may also be mounted outside of the heat sink 116 to avoid any effect that the heat sink may have on signal propagation.

The additional small patches 104, 108 may be configured to carry a single die so that multiple patches are used on each side. Alternatively, a single patch may carry multiple radio dies as shown. The patch on interposer package concept offers a cost savings by using lower cost interposer material and a small amount of patch material. Accordingly, the size and positions of the patches may be selected to simplify assembly and minimize cost. The antennas for each radio die may be built as part of the corresponding patch or may be on the interposer. The coarser pitch structure may easily be made to accommodate an antenna structure.

Two large patches 104, 108 are shown on opposite sides of the CPU and the interposer to carry all of the radio dies. This is provided as an example and other configurations are shown in other drawings. Different linear and rectangular shapes may be used. Alternatively, a "ring patch" may be used to accommodate even more radios. With a ring-shaped, arced or curved patch, several radio dies may be attached to the patch facing in different directions, then, as with the other patches, the patch is attached to the interposer.

The radio dies 106, 110 are all coupled to the integrated circuit die 114 through traces 130, 132 on the top surface of the interposer. While the traces are shown as being on the top surface, the traces may also and alternatively be routed in the inner metal layers of the interposer. Most of the traces between the CPU patch and radio patches are low frequency signals, but may require impedance control and noise immunity from external sources. For that reason, grounded-coplanar waveguides may be used for the surface routing. Routing inside the patch and interposer may have better impedance and noise conditions. Structures similar to stripline transmission lines may be used for critical routing inside the CPU patch and the interposer layers.

For simplicity, the traces are shown as a single line between the radio and the main die, however, there will be more, typically four or more traces for each radio die. These may be combined or maintained separately. These may be multiplexed at the main die and then separated by the radio dies. The traces may be on the top surface or at a lower layer, depending on the particular implementation. As shown the traces all connect to different pins of the main die, however, they may all connect at the same pin and the main die patch 112 may reroute the lines from the interposer traces to the main die.

Figure 2:
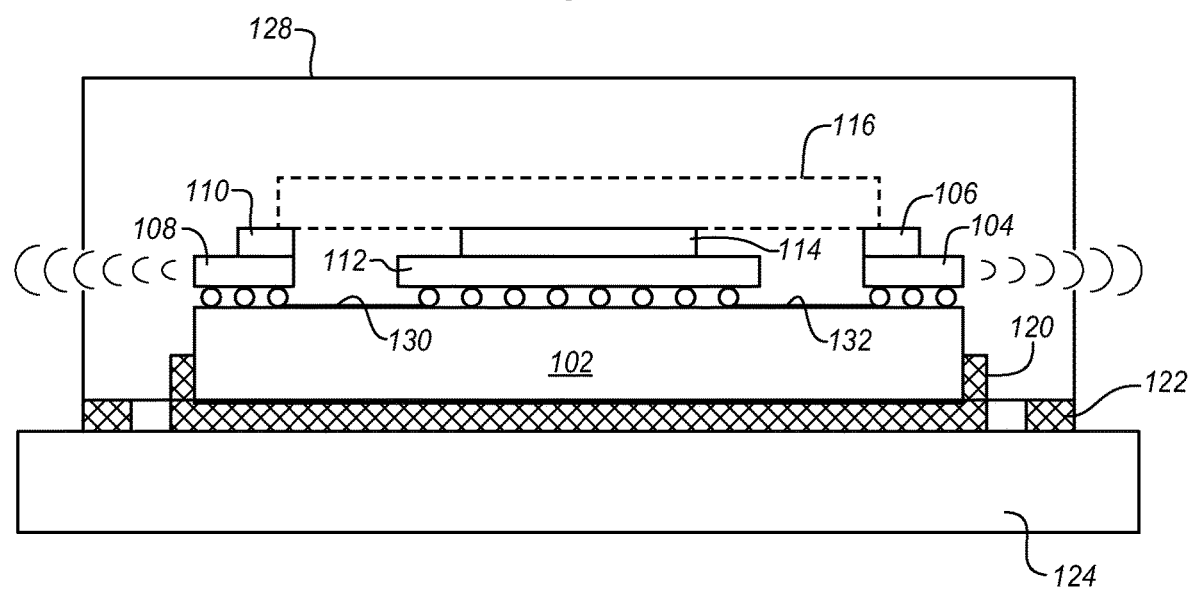
FIG. 2 is a cross-sectional side view diagram of the package of FIG. 1 mounted in a socket according to an embodiment.

FIG. 2 is a side view of the package of FIG. 1 in which the package interposer 102 is mounted to a socket 120. The socket is mounted to a motherboard or system board 124. As shown, the heat sink 116 is in the form of an integrated heat spreader (IHS). It is mechanically and electrically attached to the top of the die 114 using a thermal interface material. It also stretches from the die to the two radio dies 106, 110 so that heat from the radio dies is spread to the heat sink. While the heat sink is in contact with the tops of the radio dies, the sides of the radio dies are left uncovered. For die mounted antennas, this allows the antennas to radiate outward to other external components. Similarly, the sides of the patches are uncovered so that patch mounted antennas are able to radiate outward.

As shown in this side view, the radio die patches 104, 108 are separate and apart from the main die patch 112 and are placed near the edges of the interposer 102. The radio die patches provide a secure high density attachment point for the radio dies. As shown in FIG. 1, there may be multiple radios on each side to communicate with more than one external component or to increase the total bandwidth or data carrying capacity of the system. In this example, the package also includes a package cover 128 which operates as a heat sink for the IHS and as a protective cover for the die and patches. The cover extends over all of the components around the interposer and rests on mounts 122 on the motherboard. The cover may provide apertures as shown through which the wireless transceivers communicate.

Figure 6:
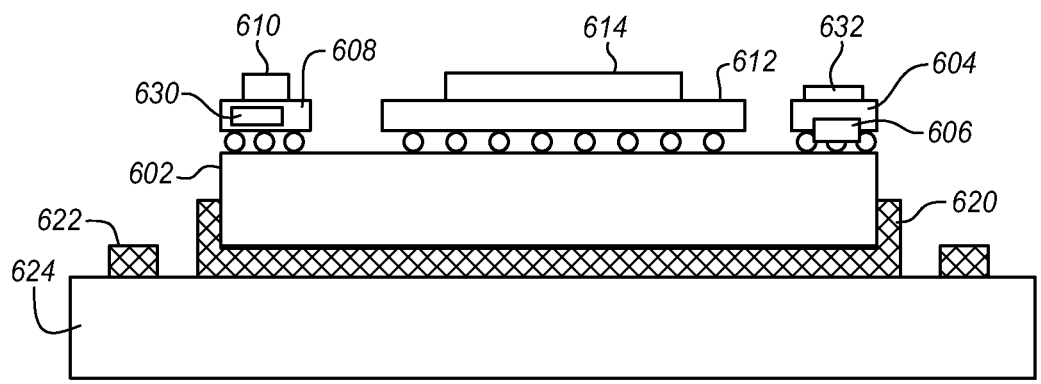
FIG. 6 is a cross-sectional side view diagram of an alternative wireless interconnect for chip-to-chip communications on a patch on interposer package according to an embodiment.
Figure 7:
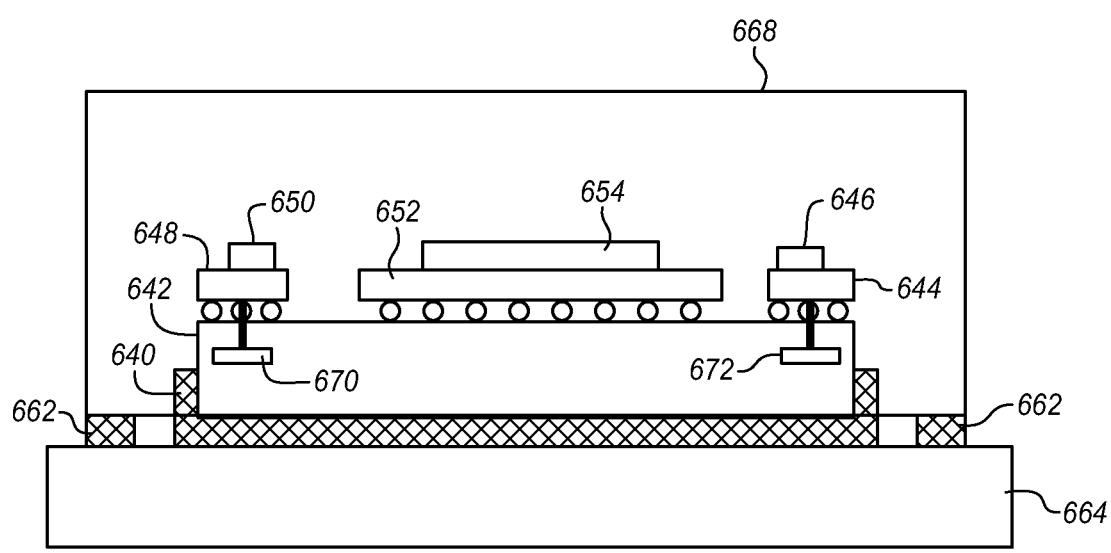
FIG. 7 is a cross-sectional side view diagram of another alternative wireless interconnect for chip-to-chip communications on a patch on interposer package according to an embodiment.

The radio dies may include antennas or the antennas may be provided as a separate structure on or in the patch or transposer. Some embodiments are shown in FIGS. 6 and 7, however, the invention is not so limited. In the present example, the antennas are formed in the patches which provide a large platform and are made from suitable antenna materials. The radio signals then travel to and from the patches 104, 108 through the apertures in the cover. The apertures may be openings or a portion of the cover that is made from a different material. Alternatively, the cover may be made of a material that is thermally conducting but transparent to millimeter wave radio waves. In such a case, no opening, aperture, or window is required. In another embodiment, the cover may be made of a conductive metal on the top surface to radiate heat and a different material, that is transparent to millimeter wave radio waves, to support the metal part.

The interposer is a dielectric structure with an array of stacked via structures as vertical interconnect structures within the interposer. The vertical vias connect between patterned horizontal metal layers between the vias. Top side connectors such as mid level interconnect (MLI) solder balls, are used to connect to the patch that is placed over the MLI solder balls. A ball grid array (BGA), land grid array (LGA) or similar structure is used on the opposite side to connect the interposer to the socket or directly to the motherboard. The patches may have different structures to suit different applications. For a CPU, the patches have a typically thin core (about 400 μm thick, for example) and support routing (RTG) and power delivery (PD) functions for the die that it carries. A CPU patch may also have build-up layers with integrated circuit routing layers that add up to about 20-30 μm. Stiffeners and passive devices, such as die side capacitors (DSC) may also be used. For radio wave transceiver dies, a different type of patch may be used. For operating at millimeter wave and sub-THz frequencies, the total radio patch may have a thickness that varies anywhere from less than 200 µm to more than 600 µm. The radio patch may have an ultra-thin core (e.g. about 40-100 µm) and build-up layers that add to about 100 µm. For the CPU, the patch is typically made of organic materials which satisfy specific CPU performance criteria. For mm-wave radios, the performance criteria are different and the demands are less. While a similar organic substrate may be used, it is not necessary. Other substrates including inorganic substrates, such as glass, low temperature co-fired ceramic, etc. may be used instead.

The patches are attached to the interposer using the MLI solder ball connectors using e.g. thermal compressive bonding (TCB) or solder reflow. Alternatively, mini-ball or surface mount technology may be used. The patches also attach to the die. The patches may include wiring layers to redistribute the die connections to a coarser pitch. The coarser pitch is more suitable for the interposer material. BGAs may be used as the MLI between a CPU patch and the interposer. For radios there are far fewer connections so that the junctions may be much shallower. For a shallow junction, an SGA (solder grid array) may be used.

Figure 3:
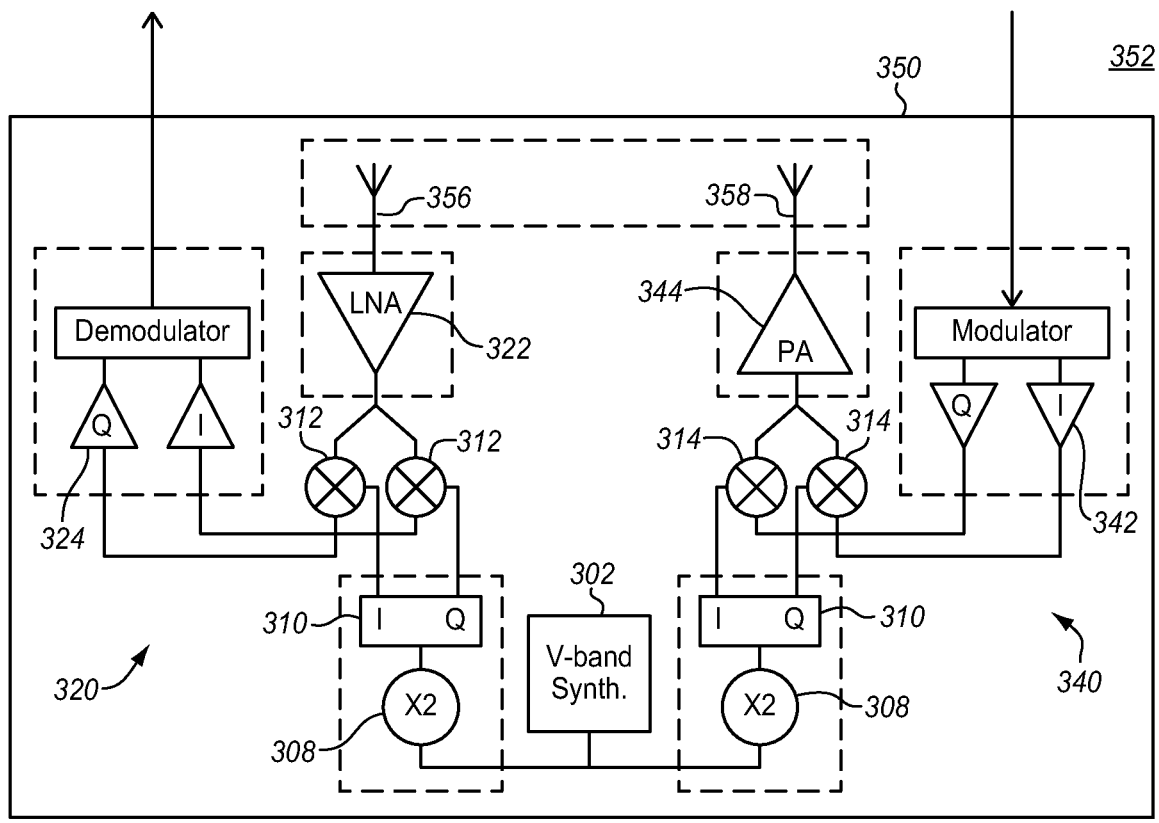
FIG. 3 is a block diagram of a radio chip and related components according to an embodiment.

FIG. 3 is a block diagram of an example of a transceiver or radio chip system architecture and connected components that may be used for the wireless interconnect described herein. The transceiver chip may take a variety of other forms and may include additional functions, depending on the particular implementation. This radio design is provided only as an example. The radio chip 350 is mounted to the package substrate 352 to which the primary integrated circuit die or chip 202, 203 is also mounted as shown in FIG. 1. The substrate 352 is mounted to the PCB or motherboard. The radio package may include a local oscillator (LO) 302 or a connection to an external LO and optionally a switch that allows the external LO feed to be used instead of or in addition to the internal LO. The LO signal may pass an amplifier and multiplier, such as an active doubler 308 and 0/90° quadrature hybrids 310 to drive an upconverter and mixers 314. The patches are not shown in this example, in order to not obscure the other details.

The RX (receive) chain 320 may contain a receive antenna 356 in the package coupled to a low noise amplifier (LNA) 322 and a wideband baseband (BB) amplification chain 324 with downconverters 312 for analog to digital conversion. The TX (transmit) chain 340 may include a BB digital driver chain 342 to the upconverters 314, and a power amplifier (PA) 344 to the transmit antenna 358. There may be multiple transmit and receive chains to transmit and receive over multiple channels simultaneously. The various channels may be combined or consolidated in different ways, depending on the particular implementation.

The TX and RX chains are both coupled through the substrate to the antenna. There may be a single antenna for TX and RX or there may be separate RX and TX antennas as shown. The antennas may be designed to have different radiation patterns to suit different wireless connections. This may allow the chip to communicate with multiple antennas in different locations on the motherboard. A narrow beam transmit and receive pattern allows power to be concentrated in a single direction for communication with just one other device.

Figure 4:
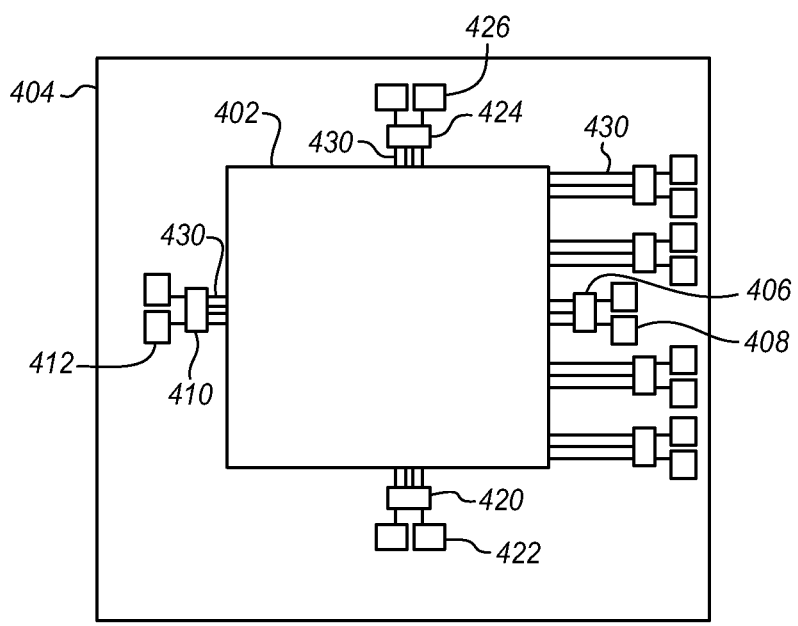
FIG. 4 is a top view diagram of a package with multiple wireless interconnects for chip-to-chip communications according to an embodiment.

FIG. 4 is a top view diagram of an example of an implementation of multiple wireless interconnects on a single PoINT package. In this example, separate antennas are used to transmit and receive, but it is also possible to share the antenna between the Tx and the Rx chains. The antenna size may vary from 1.25×1.25 mm or less to 2.5×2.5 mm or more depending on the carrier frequency, desired gain, and transmission range.

A single integrated circuit chip or die 402 includes both processing and baseband systems and is mounted to a package 404. The baseband sections of the chip are coupled through on-package traces 430 to radio chips or dies which are in turn coupled through the package to antennas. In this example, the integrated circuit chip is a CPU for a microserver and is rectangular. There are radio chips on each of the four sides of the CPU. The sides shown as top, left, and bottom in the drawing figure each have a respective radio 424, 410, 420 coupled to a respective Tx, Rx antenna pair 426, 412, 422. The side shown as the right side shows five radios each connected to a respective antenna pair. The number of radios and antennas on each side may be determined based on communication rate needs in each direction.

Very few high speed links may be required on a microserver package. A single link is able to deliver data rates in excess of 40-80 Gb/s across a distance of a few cm. The peak data rate depends on the modulation scheme. The data rate may still be on the order of 5-10 Gb/s for transmission distances of up to 50 cm.

FIG. 4 shows many wireless links implemented on the same side of one package. This allows the aggregate data rate to be increased. Alternatively, the data may be sent to different other devices that are in the same general direction. Both the radio chips and the antennas are placed towards the edge of the package to limit obstructions in the radio path that may come from heat sinks and heat spreaders. In general the losses for a copper trace baseband signal are much lower than the losses through the same copper trace for an RF (radio frequency) signal. As a result, the radio chips may be kept very close to the antenna. This limits electrical signal and power losses due to the RF routing through the substrate. The radio chip may be installed onto the package in any manner desired and may even be embedded in or a part of the substrate. By using multiple radios, the on-package mm-wave wireless interconnects can be scaled for extremely high data rate applications. This may be useful in systems such as servers and media recording, processing, and editing systems. As shown, multiple links can be put together to achieve data-rates close to a Tb/s.

Figure 5:
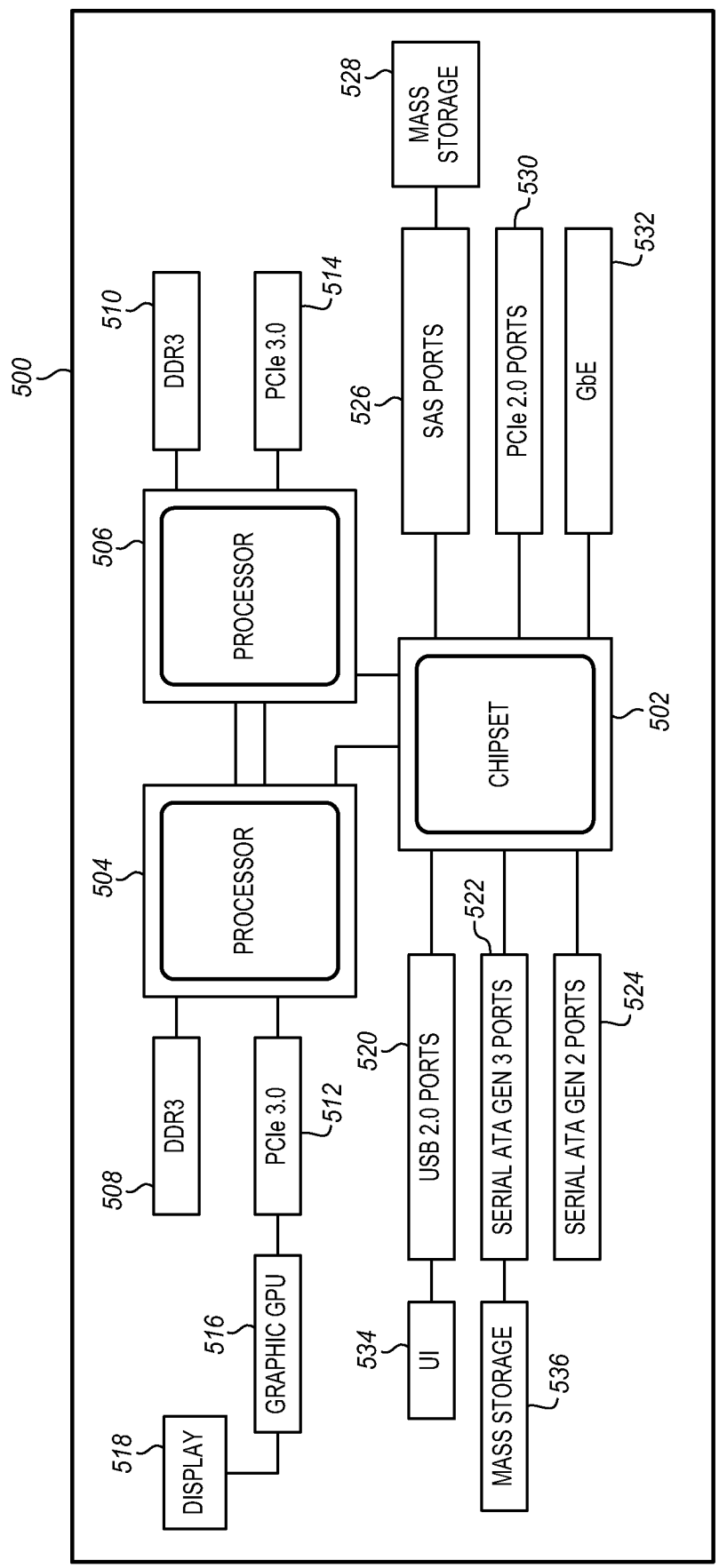
FIG. 5 is block diagram of a computing system with multiple high speed interfaces according to an embodiment.

FIG. 5 is a block diagram of a computing system 500 with multiple high speed interfaces that may be implemented using the wireless connections as described herein. The computing system may be implemented as a server, microserver, workstation, or other computing device. The system has two processors 504, 506 having multiple processing cores although more processors may be used, depending on the particular implementation. The processors are coupled together through a suitable interconnect such as the wireless interconnect described herein. The processors are each coupled to a respective DRAM (Dynamic Random Access Memory) module 508, 510 using a suitable connection, such as the wireless connection described herein. The processors are also each coupled to a PCI (Peripheral Component Interconnect) interface 512, 514. This connection may also be wired or wireless.

The PCI interfaces allow for connections to a variety of high speed additional components such as graphics processors 516 and other high speed I/O systems for display, storage and I/O. The graphics processor drives a display 518. Alternatively, the graphics processor is core or a die within one or both of the processors. The graphics processor may also be coupled to a different interface through a chipset.

The processors are also both coupled to a chipset 502 which provides a single point of contact for many other interfaces and connections. The connection to the chipset may also be wired or wireless, one or both of the processors may be connected to the chipset, depending on the implementation. As shown, a processor 504 may have a wireless connection to one or more processors 506, memory 508, peripheral components 512, and a chipset 502. These connections may all be wireless as suggested by the multiple radio and antennas of FIG. 4. Alternatively, some of these connections may be wired. The processor may have multiple wireless links to the other processor. Similarly the chipset 502 may have wireless connections to one or more of the processors as well as to the various peripheral interfaces as shown.

The chipset is coupled to USB (Universal Serial Bus) interface 520 which may provide ports for connections to a variety of other devices including a user interface 534. The chipset may be connected to SATA (Serial Advanced Technology Attachment) interfaces 522, 524 which may provide ports for mass storage 536 or other devices. The chipset may be connected to other high speed interfaces such as a SAS (Serial Attached Small computer serial interface) interface 526 with ports for additional mass storage 528, additional PCI interfaces 530 and communications interfaces 532, such as Ethernet, or any other desired wired or wireless interface. The described components are all mounted to one or more boards and cards to provide the described connections.

FIG. 6 is a cross-sectional side view diagram of an alternative package configuration. In this example, a patch on interposer package has antennas on the radio patches. A main die 614, such as a CPU, memory, communications or data interface, or other type of die is attached to a patch 612, which is coupled to an interposer 602. The interposer is mounted to a socket 620 that is mounted to a motherboard 624 or some other system board. Each side of the interposer has one or more special small patches 604, 608 of which only one is shown on each side. The radio dies 606, 610 are each attached to a respective patch to provide millimeter-wave communications to other packages on the same board or another nearby board or even to a switch to be routed to another location.

In one example, the radio die 610 is mounted to the top of the patch 608 as in the previously described examples. In such a case, there are traces from the main die 614 through the main patch 612 across the interposer to electrically connect to the radio die through the radio patch. The traces and the connections through the patches carry data and may also carry control signals between the main die and the radio die. The radio die is coupled to an antenna 630 to direct the data signals over millimeter waves to the appropriate external component. The antenna in this case is formed within layers of the patch. This may be done by forming appropriate metal shapes in the metal layers of the patch and between dielectric layers. Any of a variety of different antenna shapes may be formed by controlling the shapes of the metal layers.

In the other example, the radio die 606 is located on bottom side of the patch 604. A well is formed on the bottom side of the patch that is large enough for the radio die to fit within the well. Due to the well, the radio die does not interfere with the solder ball connection between the patch and the interposer. This example illustrates that the radio die may be placed in different positions on the patch to accommodate other components. In this case, moving the die to the bottom side of the patch allows an antenna 632 to be mounted to the top of the patch. The radio die and the antenna may be connected through the metal layers of the patch. From the top of the radio patch, the antenna is able to communicate with external components and avoid any obstructions that may be caused by the socket or other nearby devices on the motherboard.

As shown the wireless interconnects 606, 610, 630, 632 are fully integrated on the respective patches 606. 608. Both the radio dies and the antennas of the radio transceivers are on the same patch or substrate.

In the illustrated example, there is no cover, but heat sink mounts 622 are shown. These are used to hold the heat sink over the package and socket when the heat sink is installed. Since the antennas are also covered by the heat sink, openings or windows may be provided in the heat sink to allow millimeter wave signals to go through the heat sink.

FIG. 7 is a cross-sectional side view diagram of another alternative package configuration. In this example, the integration is split between the patch 644, 648 and the interposer 642. The fine pitch radio dies 646, 650 are assembled on the respective patch while the antennas 670, 672 are implemented on the interposer. As in the above example, the antenna is formed using metal layers embedded inside the substrate stack up. The fabrication operations are similar to that for making a PoINT package with a single CPU die with the exception that multiple radio patches with pre-assembled radio dies are attached to the interposer at the same time as the CPU patch.

The PoINT package has a main die 654 assembled onto a patch 652 which is mounted to the interposer 642. The interposer also has the radio die patches 644, 648 with corresponding attached radio dies 646, 650. In this example, the radio die are attached to the top surfaces of the radio patches as in the previous example, however, the radio dies may be mounted in many other positions on the patch, depending on the particular needs for the system.

In this example, the antennas 670, 672 for both radios are formed in the layers of the interposer and not in or on the patch. The coarse pitch of the interposer is well-suited to millimeter wave radio antennas. The radio dies may be coupled to the respective antenna through the patch and through the solder ball connection to the interposer. While the antennas are shown as being directly under the respective radio die, the metal layers of the interposer may be used to translate the data signals from the radio die to another location. Using the interposer, each antenna may be moved to any suitable location which may be adjacent to or spaced apart from the location of the antenna.

FIG. 7 also shows the heat sink 668 attached over the package as a cover and attached to the heat sink mounts 662. As shown, this covers the radios and antennas, but the heat sink may be adapted to accommodate millimeter wave transmission through the heat sink.

Figure 8:
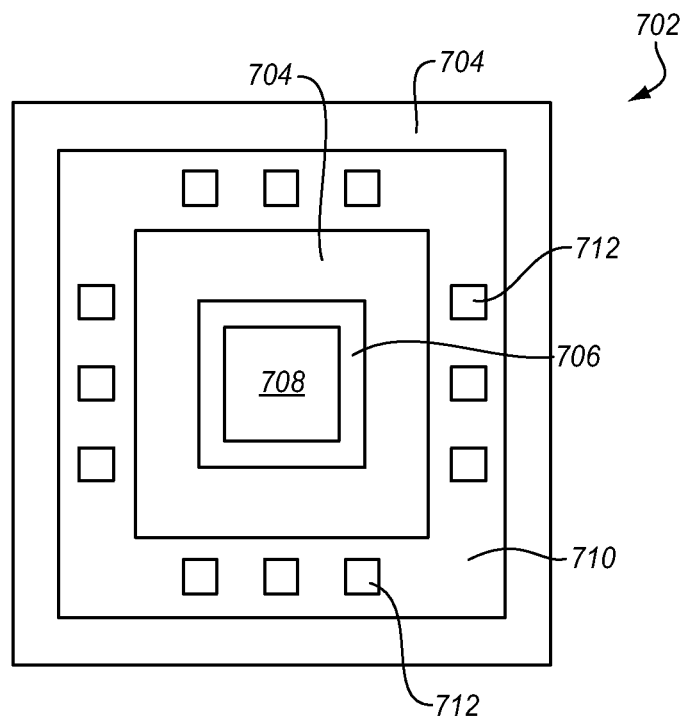
FIG. 8 is a top plan view of another alternative wireless interconnect for chip-to-chip communications on a patch on interposer package according to an embodiment.

FIG. 8 is a top view diagram of an alternative CPU package with no cover. The package has an interposer 704. A CPU 708 is coupled to a central CPU patch 706 that is in turn attached near the center of the interposer. A set of radios 712 are attached to many different positions around a ring patch 710. The ring patch is attached to the interposer around the CPU patch. The ring patch forms a ring, or enclosure, and surrounds the CPU patch. While the ring patch is shown as completely surrounding the main CPU patch on all four side of the interposer, the ring patch may surround the main patch on only two or three sides and may not extend across an entire side of the interposer.

The ring patch, like the other radio patches described herein are shown as being placed near the edge or on the periphery of the interposer. This is to allow a more clear path from the package to external components. It has been found that radio channel performance is better with the radio near the edge of the package and the radio near to the antenna, however, the best placement for the radio and for the antenna will depend on the mechanical characteristics of the package and the intended propagation direction for the radio signals. When the antennas are formed in or on the patch, then there is a significant benefit to placing the patch near the edge of the package and beyond any heat sink or cover. When the antennas are formed in the interposer, there is still a benefit to placing the patches near the antenna, but the radio may be farther from the edge of the interposer.

Figure 9:
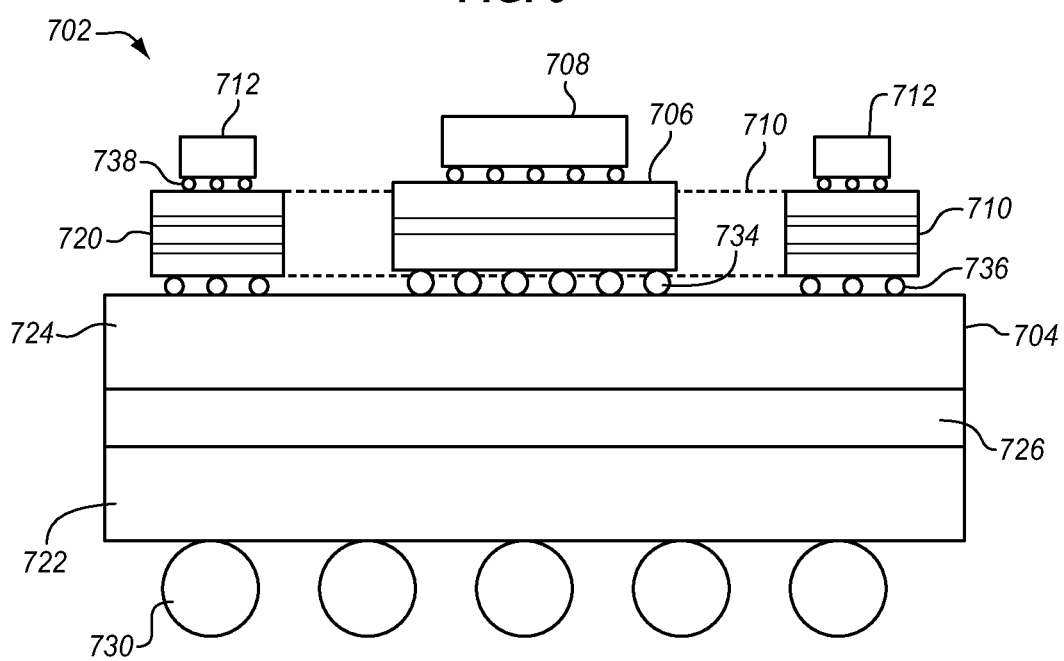
FIG. 9 is a cross-sectional side view diagram of the package of FIG. 8 according to an embodiment

FIG. 9 is side cross-sectional view diagram of the same package. In this view the interposer 704 has a central stiffener or core 726 that forms the structure of the package. The ring patch 710 extends all around the outside edge of the interposer and carries multiple radios 712 in different locations. This may be used to allow the radios to better communicate with other components in different positions around the interposer. The radios are attached to the ring patch with a lower cost low pitch attachment 738, such as a solder grid array. The radio or ring patch may be attached to the interposer with a similar SGA 736. The central CPU 708 may be attached with a finer pitch higher thermal stress system 740. The CPU patch may then be attached to the interposer with a lower pitch array, such as a ball grid array 734. The interposer is shown as attaching externally with another BGA 730, although for each of these connections other attachments may also be used.

As shown, the ring patch has numerous wiring layers 720 to connect the radio to antennas and to connect radios to the CPU. Similarly, the interposer has wiring layers 724 above the core 726 to connect the radios to the CPU. Wiring layers 722 below the core may be used to connect the CPU to the external BGA 730 or other connector. The wiring layers above and below the core may be coupled together using vias (not shown) or any other desired structure. The CPU patch similarly has multiple wiring layers (not shown) to route the many CPU connections as desired. The wiring layers, connection arrays and other features may also be a part of any of the other embodiments described herein. The patches may be made of different materials with different dimensions, as mentioned above. While only rectangular patches have been shown, the invention is not so limited and the patches may be adapted to suit different form factors, radio transmission characteristics, and functions.

Figure 10:
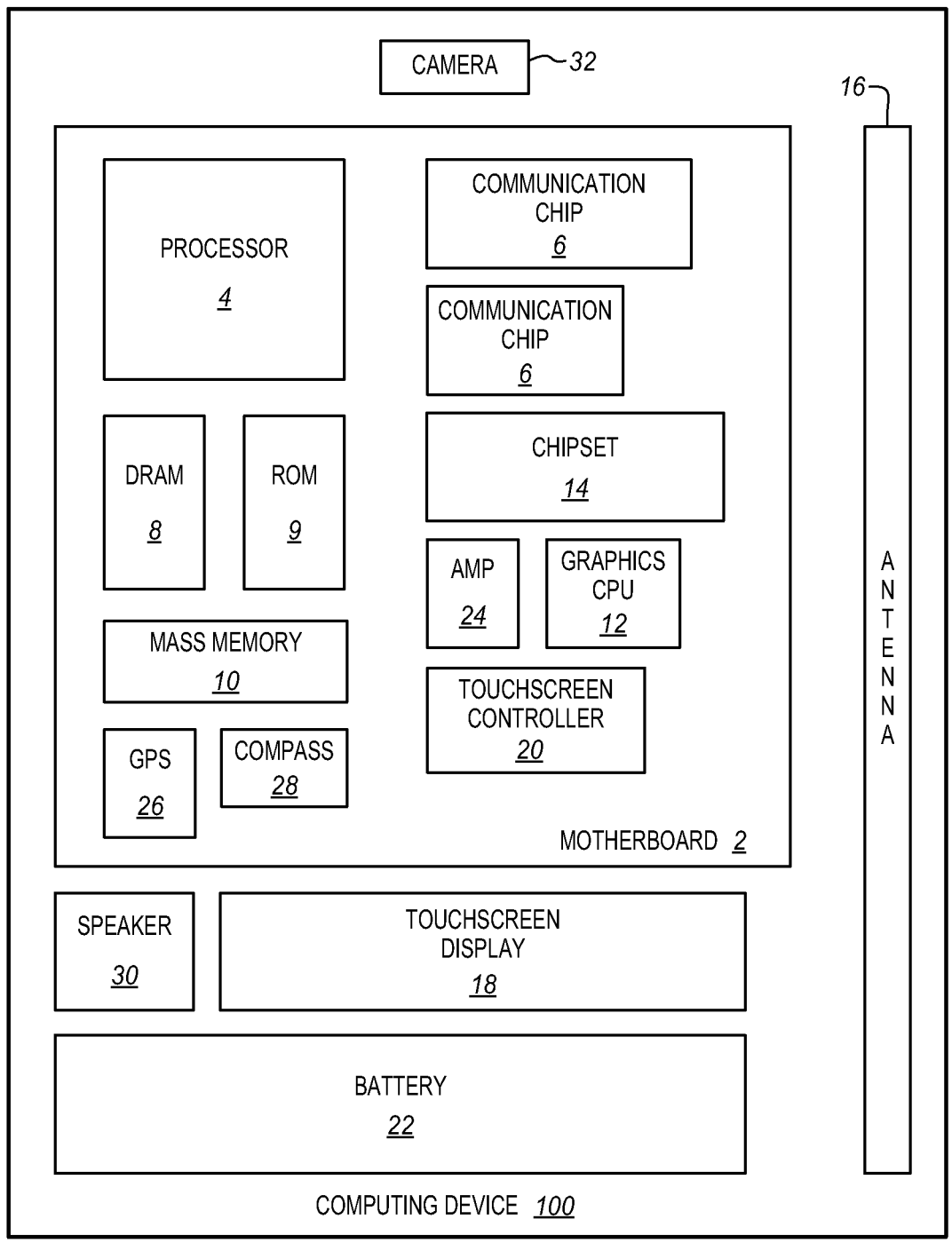
FIG. 10 is a block diagram of a computing device incorporating wireless interfaces according to an embodiment.

FIG. 10 illustrates a computing device 100 in accordance with another implementation. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, any one or more of the components may be adapted to use the wireless connection described herein. The features of the system of FIG. 12 may be adapted to that of FIG. 7 and vice versa. For example, the system of FIG. 12 may carry multiple processors. The system of FIG. 7 may include any one or more of the peripherals shown in FIG. 12. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an integrated circuit die package that includes an interposer, a main patch attached to the interposer, a main integrated circuit die attached to the patch, a second patch attached to the interposer, and a millimeter wave radio die attached to the second patch and coupled to the main integrated circuit die through the interposer to communicate data between the main die and an external component.

In some embodiments, the second patch is near an edge of the interposer.

Further embodiments include an antenna on the patch coupled to the radio die for sending and receiving millimeter wave signals.

Further embodiments include an antenna on the interposer coupled to the radio die for sending and receiving millimeter wave signals.

Further embodiments include a plurality of millimeter wave radios attached to the second path to communicate data between the main die and the external component.

In some embodiments, the radio die is coupled to the main die through traces on the interposer.

Further embodiments include a third patch attached to the interposer on a side of the interposer opposite the second patch and a second millimeter wave radio attached to the third patch to communicate data between the main die and another external component.

Further embodiments include a heat spreader over the main die and the radio die to spread heat from the main die and the radio die.

In some embodiments, the radio patch comprises an ultra thin core of less than 100 µm and build up layers that add up to less than 100 µm, In some embodiments, the radio patch is formed of an inorganic substrate.

In some embodiments, the main patch is formed of an organic substrate material.

In some embodiments, a ball grid array is used as a mid level interconnect to attach the main patch to the interposer and a solder grid array is used as a mid level interconnect to attach the second patch to the interposer.

In some embodiments, the second patch is attached to the interposer with a shallow junction.

In some embodiments, the second patch surrounds the main patch on at least two sides of the interposer.

Some embodiments pertain to a computing system that includes a system board, a central processing unit (CPU), an interposer as a package substrate mounted to the system board to carry the CPU, the CPU being mounted to a patch attached to the interposer, the package substrate having conductive connectors to connect the CPU to external components, a millimeter wave radio mounted to a radio patch attached to the interposer coupled to the CPU through the interposer to modulate the data onto a carrier and to transmit the modulated data to an external component, and a chipset carried by the system board coupled through the system board to the integrated circuit chip through the package.

Further embodiments include a second central processing unit (CPU), a second interposer as a package substrate mounted to the system board to carry the second CPU on a patch, and a second millimeter wave radio mounted to a second radio patch attached to the second interposer coupled to the CPU through the interposer to modulate the data onto a carrier and to transmit the modulated data to an the first millimeter wave radio.

Further embodiments include an antenna formed in the radio patch and coupled to the radio through the patch.

Some embodiments pertain to an apparatus that includes an interposer, an organic multilayer patch attached to a central area of the interposer, a central processing unit attached to the organic patch, an inorganic multilayer patch attached to an edge of the interposer, and a plurality of millimeter wave radio dies attached to the inorganic patch.

Further embodiments include traces through the interposer to connect the central processing unit to the radio dies.

Further embodiments include a plurality of antennas in the interposer each coupled to a respective radio die through the inorganic patch.

The invention claimed is:

1. An integrated circuit die package comprising:
   an interposer;
   a main patch attached directly to the interposer;
   a main integrated circuit die attached directly to the main patch;
   a second patch attached directly to the interposer, the second patch separate and distinct from the first patch; and
   a millimeter wave radio die attached directly to the second patch and coupled to the main integrated circuit die through the interposer to communicate data between the main integrated circuit die and an external component.

2. The package of claim 1, wherein the second patch is near an edge of the interposer.

3. The package of claim 1, further comprising an antenna on the second patch coupled to the radio die for sending and receiving millimeter wave signals.

4. The package of claim 1, further comprising an antenna on the interposer coupled to the radio die for sending and receiving millimeter wave signals.

5. The package of claim 1, further comprising a plurality of millimeter wave radios attached to the second path to communicate data between the main die and the external component.

6. The package of claim 1, wherein the radio die is coupled to the main die through traces on the interposer.

7. The package of claim 1, further comprising a third patch attached to the interposer on a side of the interposer opposite the second patch and a second millimeter wave radio attached to the third patch to communicate data between the main die and another external component.

8. The package of claim 1, further comprising a heat spreader over the main die and the radio die to spread heat from the main die and the radio die.

9. The package of claim 1, wherein the radio patch comprises an ultra thin core of less than 100 μm and build up layers that add up to less than 100 μm.

10. The package of claim 9, wherein the radio patch is formed of an inorganic substrate.

11. The package of claim 10, wherein the main patch is formed of an organic substrate material.

12. The package of claim 1, wherein a ball grid array is used as a mid level interconnect to attach the main patch to the interposer and a solder grid array is used as a mid level interconnect to attach the second patch to the interposer.

13. The package of claim 1, wherein the second patch is attached to the interposer with a shallow junction.

14. The package of claim 1, wherein the second patch surrounds the main patch on at least two sides of the interposer.

15. A computing system comprising:
a system board;
a central processing unit (CPU);
an interposer as a package substrate mounted to the system board to carry the CPU, the CPU being mounted directly to a patch attached directly to the interposer, the package substrate having conductive connectors to connect the CPU to external components;
a millimeter wave radio mounted directly to a radio patch attached directly to the interposer coupled to the CPU through the interposer to modulate the data onto a carrier and to transmit the modulated data to an external component, wherein the radio patch is separate and distinct from the patch; and
a chipset carried by the system board coupled through the system board to the integrated circuit chip through the package.

16. The computing system of claim 15, further comprising:
a second central processing unit (CPU);
a second interposer as a package substrate mounted to the system board to carry the second CPU on a patch; and
a second millimeter wave radio mounted to a second radio patch attached to the second interposer coupled to the CPU through the interposer to modulate the data onto a carrier and to transmit the modulated data to an the first millimeter wave radio.

17. The computing system of claim 15, wherein the first and second radio patches are formed of an inorganic substrate and attached using a shallow junction.

18. An apparatus comprising:
an interposer;
an organic multilayer patch attached directly to a central area of the interposer;
a central processing unit attached directly to the organic patch;
an inorganic multilayer patch attached directly to an edge of the interposer, the inorganic multi-layer patch separate and distinct from the organic multilayer patch; and
a plurality of millimeter wave radio dies attached directly to the inorganic patch and coupled to the central processing unit through the interposer to communicate data between the central processing unit and an external component.

19. The apparatus of claim 18, further comprising traces through the interposer to connect the central processing unit to the radio dies.

20. The apparatus of claim 18, further comprising a plurality of antennas in the interposer each coupled to a respective radio die through the inorganic patch.

* * * * *